US006916731B2

(12) United States Patent
Shimokawa et al.

(10) Patent No.: US 6,916,731 B2
(45) Date of Patent: Jul. 12, 2005

(54) BALL TRANSFERRING METHOD AND APPARATUS

(75) Inventors: Kenji Shimokawa, Chiba (JP); Eiji Hashino, Chiba (JP); Kohei Tatsumi, Chiba (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/760,107

(22) Filed: Jan. 12, 2001

(65) Prior Publication Data

US 2002/0137324 A1 Sep. 26, 2002

(51) Int. Cl.[7] .......................... H01L 29/20; H01L 29/167
(52) U.S. Cl. ..................... 438/612; 438/615; 438/616
(58) Field of Search ................... 438/612, 615, 438/61.6; 228/246, 262, 180.5, 221, 179.1

(56) References Cited

U.S. PATENT DOCUMENTS 5,431,332 A * 7/1995 Kirby et al.
5,657,528 A * 8/1997 Sakemi et al.
5,687,901 A * 11/1997 Hoshiba et al.

FOREIGN PATENT DOCUMENTS

| JP | 7-153765 | 6/1995 |
| JP | 8-112671 | 5/1996 |
| JP | 11111767 A * | 4/1999 |
| JP | 2000-12593 | 1/2000 |
| JP | 2000232132 A * | 8/2000 |

* cited by examiner

Primary Examiner—Ha Tran Nguyen
(74) Attorney, Agent, or Firm—Kenyon & Kenyon

(57) ABSTRACT

Balls are sucked onto a carrier board so as to be temporarily arranged in a ball arrangement region of the board, and then the balls are transferred and bonded onto an objective substance with their positions being adjusted. Gas blow is applied to the temporarily arranged balls or alternatively the temporarily arranged balls are sucked, so as to remove excess balls other than balls that have been exactly sucked onto the ball arrangement region. Cooperation with application of fine vibration to the carrier board makes the removal of the excess balls more efficient.

14 Claims, 7 Drawing Sheets

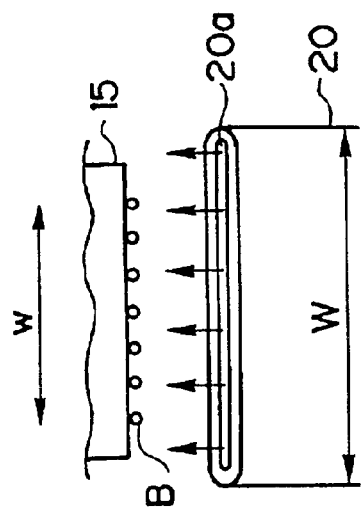
F I G. 5 A
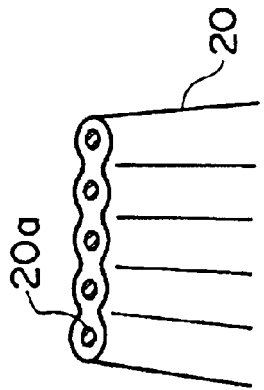
F I G. 5 B
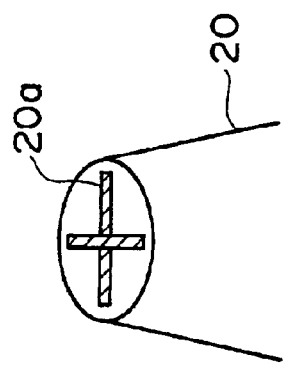
F I G. 5 C
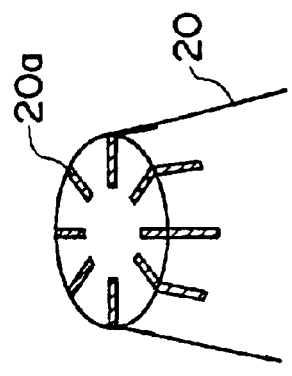
F I G. 5 D
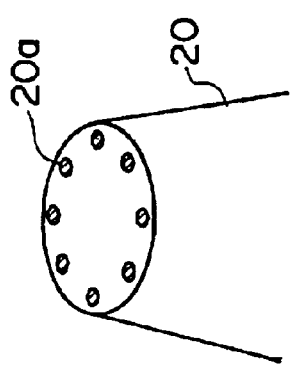
F I G. 5 E FIG. 6A   FIG. 6B   FIG. 6C
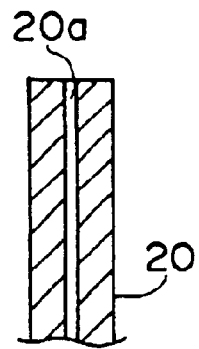
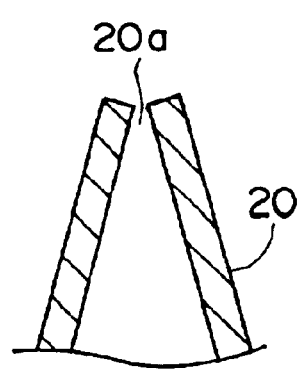
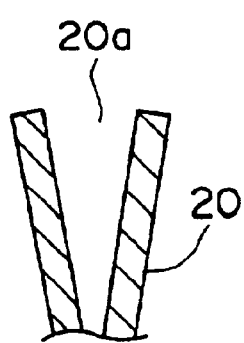
FIG. 7
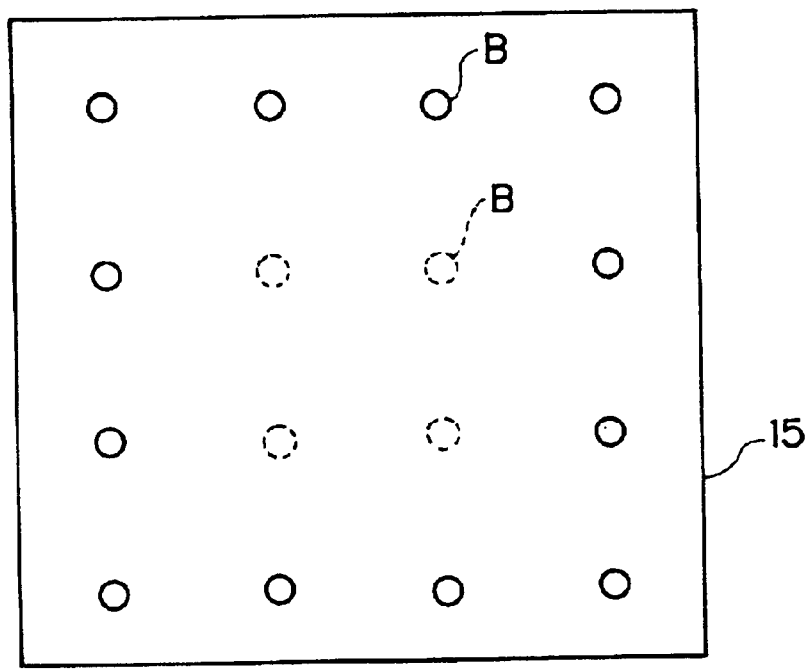

BALL TRANSFERRING METHOD AND APPARATUS

BACKGROUND OF THE INVENTION

1. Field of the Invention

The present invention relates to ball transferring methods and apparatus for transferring balls to form spherical bumps on electrodes of a semiconductor device, a printed circuit board, or the like. In particular provided are techniques for removing excess balls from a ball carrier on which balls being transferred are temporarily arranged.

2. Description of the Related Art

Japanese Patent Application Laid-open No. 7-153765 discloses spherical bump bonding method and apparatus for easily and surely bonding spherical bumps onto electrodes of a semiconductor device, a printed circuit board, or the like.

Japanese Patent Application Laid-open No. 8-112671 discloses a feature that vibration is applied to a suction head with solder balls being carried thereon in order to allow the solder balls to drop off.

In the method disclosed in the former Japanese Patent Application Laid-open No. 7-153765, as shown in FIGS. 1A and 1B for example, an apparatus is used which comprises a ball arranging unit 1, a carrier board conveying mechanism 2, ball inspection means 3, and a bonding stage 4.

In the ball arranging unit 1, as shown in FIG. 2, fine metallic balls B are put in a ball stocking tray 11, which is vibrated with a vibrator 12. The balls B are thereby made to jump effectively and sucked onto ball suction means 13. The ball suction means 13 is provided with a ball carrier board 15 where suction holes 14 each having a diameter smaller than the ball diameter are arranged into a predetermined pattern. The pattern preferably corresponds to the area of two or more semiconductor chips.

The ball suction means 13 is lowered to the vicinity of the ball stocking tray 11 and balls B are sucked onto the respective suction holes 14 of the carrier board 15 by vacuum.

The ball suction means 13 is then lifted up and excess balls B' other than balls B that have been exactly sucked onto the respective suction holes 14 are removed and collected for reuse. The exactly sucked balls may be referred to as normal balls hereinafter. In the prior art apparatus, a vibrator 16 is used as means for removing the excess balls. The vibrator 16 applies fine vibration to the ball suction means 13 in order that only the excess balls B' may be removed without removing the normal balls B.

In this manner, the excess balls B' can be removed so that only one ball B is sucked onto each suction hole 14 of the carrier board 15. This brings about an exact arrangement of the balls B on the carrier board 15 and so shortening of the mass production tact time.

However, if the carrier board 15 has a soil and a excess ball B' has adhered to the carrier board 15 through the soil, the soil may serve as a buffer between the excess ball B' and the carrier board 15, so that the vibration is not properly transmitted to the excess ball B' and the excess ball B' can not be removed. In this case, application of more intense vibration may result in removal of normal balls B.

For this reason, the carrier board 15 has been cleaned in general. In case of a ball size of less than 300 $\mu$m, particularly less than 150 $\mu$m, however, even a very small soil or dirt may cause such adhesion of a excess ball B'.

Besides, if too intense vibration is applied upon sucking balls in order to avoid excess ball adhesion, a normal ball B exactly sucked onto a suction hole of the carrier board 15 may rotate as it is being sucked. This may cause damage on the ball surface, which damage leads to an erroneous detection upon optical inspection of the ball arrangement. Besides, if removed excess balls are scattered in the ball transferring apparatus, then it mostly results in a machine trouble.

SUMMARY OF THE INVENTION

It is an object of the present invention to provide ball transferring method and apparatus capable of an exact and proper ball arrangement with very high accuracy.

According to an aspect of the present invention, a ball transferring method comprises the steps of: sucking balls onto a carrier board so as to arrange temporarily said balls in a ball arrangement region of said carrier board; applying gas blow to said ball arrangement region so as to remove excess balls other than balls that have been exactly sucked onto said ball arrangement region; and transferring and bonding the remaining balls onto an objective substance with positional adjustment being made.

According to another aspect of the present invention, a ball transferring apparatus comprises: a carrier board onto which balls are sucked, said carrier board including a ball arrangement region in which said balls sucked are temporarily arranged; a gas nozzle disposed near said carrier board for applying gas blow to said ball arrangement region so as to remove excess balls other than balls that have been exactly sucked onto said ball arrangement region; and means for transferring and bonding the remaining balls onto an objective substance with positional adjustment being made.

According to still another aspect of the present invention, a ball transferring method comprises the steps of: sucking balls onto a carrier board so as to arrange temporarily said balls in a ball arrangement region of said carrier board; sucking said ball arrangement plane, so as to remove excess balls other than balls that have been exactly sucked onto said ball arrangement region; and transferring and bonding the remaining balls onto an objective substance with positional adjustment being made.

According to still another aspect of the present invention, a ball transferring apparatus comprises: a carrier board onto which balls are sucked, said carrier board including a ball arrangement region in which said balls sucked are temporarily arranged; a suction nozzle disposed near said carrier board for sucking said ball arrangement plane, so as to remove excess balls other than balls that have been exactly sucked onto said ball arrangement region; and means for transferring and bonding the remaining balls onto an objective substance with positional adjustment being made.

According to still another aspect of the present invention, a ball transferring method comprises the steps of: sucking balls onto a carrier board so as to arrange temporarily said balls in a ball arrangement region of said carrier board; in a state that said balls are fully firmly fixed to said ball arrangement region, applying gas blow through a nozzle to said ball arrangement region or sucking said balls through a nozzle, and optionally applying fine vibration to said carrier board, so as to remove excess balls other than balls that have been exactly sucked onto said ball arrangement region; and when transferring the remaining balls onto an objective substance with positional adjustment being made, applying vibration to said carrier board so that said balls which have been sucked to be in contact with said ball arrangement region may be allowed to drop off.

BRIEF DESCRIPTION OF THE DRAWINGS

FIGS. 5A to 5E are perspective partial views showing examples of gas nozzles usable in the embodiment;

FIGS. 6A to 6C are partial sectional views showing examples of gas nozzles usable in the embodiment;

FIG. 7 is a schematic plane view showing examples of temporary ball arrangement pattern according to the embodiment.

DETAILED DESCRIPTION OF THE PREFERRED EMBODIMENTS

According to the present invention, bumps are formed on electrodes of a semiconductor device, a printed circuit board, or the like, by transferring and bonding fine metallic balls onto the electrodes. The balls to be transferred are sucked onto and temporarily arranged in a ball arrangement region of a ball carrier board.

The temporary ball arrangement process according to the present invention comprises several stages from a ball suction stage to a ball bonding stage. More specifically, in the temporary ball arrangement process, the ball suction head of a ball transferring apparatus according to the present invention is lowered for sucking balls, then raised with sucked balls, and then lowered again for transferring and bonding the balls onto the electrodes. In the temporary ball arrangement process, gas is blown against the balls temporarily arranged on the carrier board to remove excess balls other than the normal balls exactly sucked onto the carrier board.

At this time, the gas is blown against the balls with a proper intensity that does not exceed the suction force for sucking each normal ball onto the carrier board. Only the excess balls can surely be removed thereby. The principle of the excess ball removing action according to the present invention will be described below with reference to FIG. 3.

Figure 3:
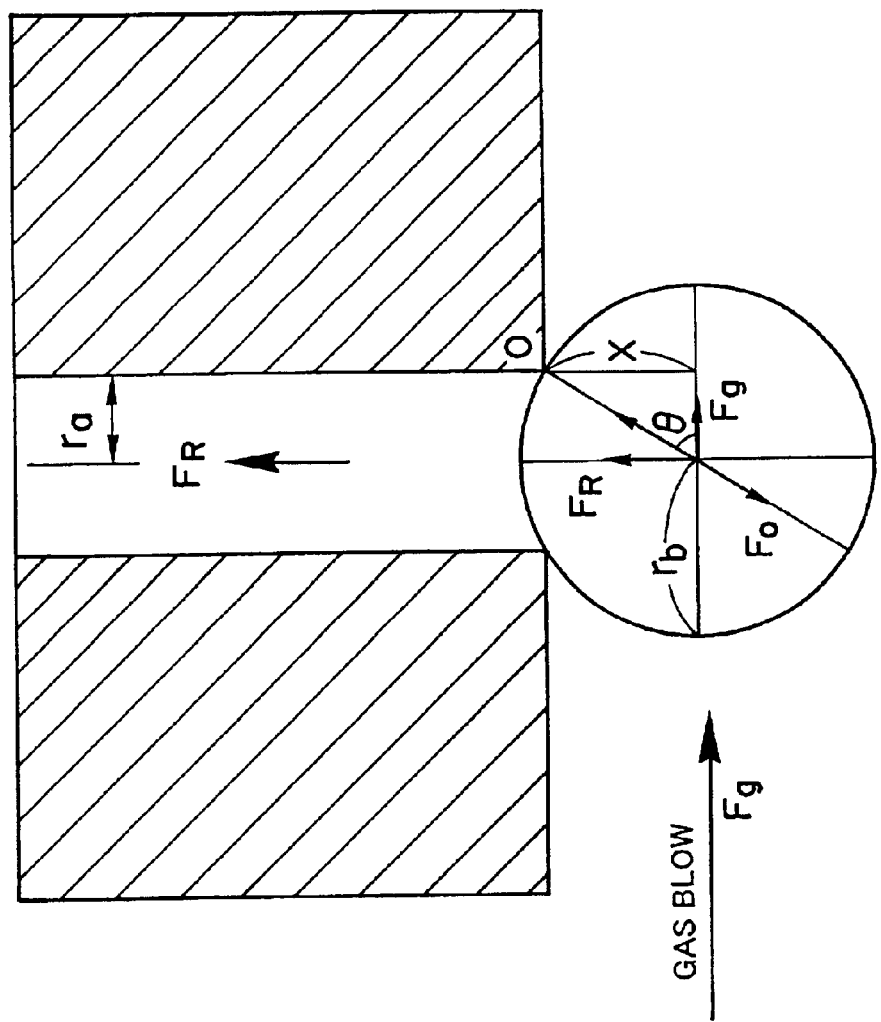
FIG. 3 is a schematic enlarged sectional view for explaining the principle of the present invention.

In FIG. 3, $F_R$ represents the suction force for sucking a ball onto a suction hole of the ball suction head; $F_g$ does the force that the ball receives from the gas blow; $F_O$ does the drag of the point O onto the ball; $r_a$ does the radius of the suction hole; $r_b$ does the radius of the ball; θ does the angle between the carrier board and the drag $F_O$; and X does the vertical distance between the ball arrangement plane (including the point O) and the center of the ball. In FIG. 3, a model is discussed in which the gas blow acts on the ball sucked by the suction force $F_R$ and the ball is going to move around the point O and come off the ball arrangement plane. Either of the force $F_g$ and the suction force $F_R$ acts on the centroid of the ball (that coincides with the geometric center of the ball in this example).

At the time when the ball is going to be moved by the force $F_g$, the resultant force of the force $F_g$, the suction force $F_R$, and the drag $F_O$ becomes zero so that these three forces balance. This state gives the following conditions:

$$F_R = F_O \sin\theta; \text{ and } F_g = F_O \cos\theta.$$

From the above conditions, $F_g/\cos\theta = F_R/\sin\theta$. Hence, $$F_g = F_R/\tan\theta \qquad (1).$$

From the relation between the radius $r_a$ of the suction hole and the radius $r_b$ of the ball, $$r_b^2 = X^2 + r_a^2.$$

From the above expression, $X = (r_b^2 - r_a^2)^{1/2}$.

Hence, $$\tan\theta = (r_b^2 - r_a^2)^{1/2}/r_a \qquad (2).$$

From the above expressions (1) and (2), $$F_g = F_R \cdot r_a/(r_b^2 - r_a^2)^{1/2} \qquad (3).$$

Actually, because there is a gap between the suction hole and the ball, $F_R$ has a smaller value than the value calculated with the expression (3). Thus the expression (3) should be modified using a coefficient Q as follows:

$$F_g = Q \cdot F_R \cdot r_a/(r_b^2 - r_a^2)^{1/2} \qquad (4).$$

The intensity of the gas blow is regulated with this expression (4) so that only excess balls may be fully removed while the normal balls exactly sucked onto the respective suction holes remain intact.

The coefficient Q is determined within a certain range in consideration of some conditions for implementation of the present invention such as the radius of the suction hole and the radius of the ball. Some experimental results indicate that the coefficient Q is preferably 0.8 or less, more preferably, 0.6 or less.

The force $F_g$ that is applied to the ball by the gas blow is also given by the following expression:

$$F_g = (\tfrac{1}{2})\rho v^2 S_b \qquad (5)$$

where ρ represents the gas density, v does the gas velocity, and $S_b$ does the vertical sectional area of the ball portion protruding beyond the ball arrangement plane. From the expressions (4) and (5), $$(\tfrac{1}{2})\rho v^2 S_b = Q \cdot F_R \cdot r_a/(r_b^2 - r_a^2)^{1/2}.$$

Hence, $$v = (2Q \cdot F_R \cdot r_a/(\rho S_b \cdot (r_b^2 - r_a^2)^{1/2}))^{1/2} \qquad (6).$$

It was found that gas blow having its velocity more than the value v calculated with the expression (6) might blow some normal balls off. Contrastingly, gas blow having its velocity less than the value v calculated with the expression (6) never blows any normal ball off.

Besides, a gas nozzle whose width or inclination angle to the ball arrangement plane has been properly set brings about very effective removal of excess balls. In addition, cooperation with a vibrator for applying fine vibration to the carrier board can more improve the removal efficiency.

According to the present invention, removed excess balls are collected without being scattered. Thus the machine trouble due to scattered balls can be avoided.

According to another aspect of the present invention, balls that have been temporarily arranged in the ball arrangement region of the carrier board by being sucked onto the carrier board by the above suction force $F_g$ are further sucked in a different direction by a suction force less than the suction force $F_g$. Also by this manner, excess balls other than the normal balls exactly sucked onto the carrier board can be removed.

An embodiment of the present invention will be described below with reference to FIGS. 4 to 7. In this embodiment, components corresponding to those of the above prior art are denoted by the same reference numerals as those of the prior art.

Figure 1A:
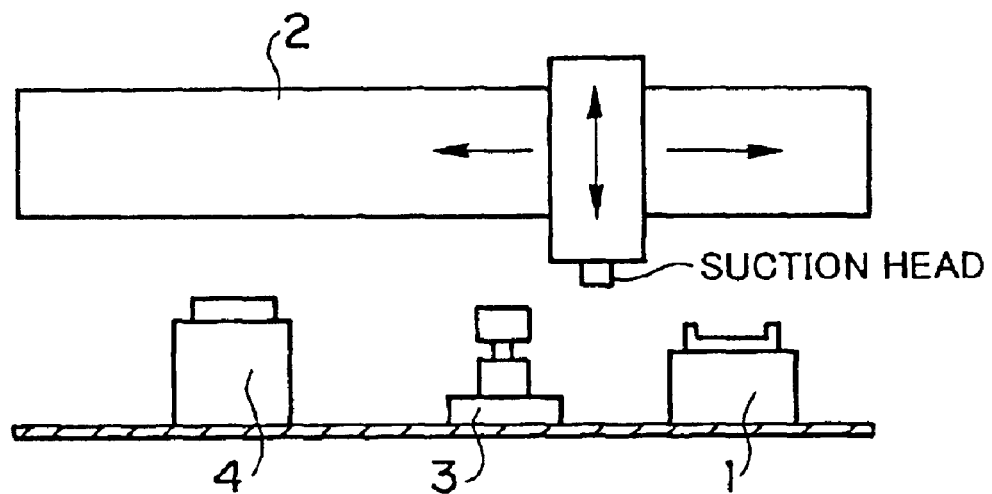
FIGS. 1A and 1B are schematic side and plane views showing the whole configuration of a prior art apparatus.
Figure 1B:
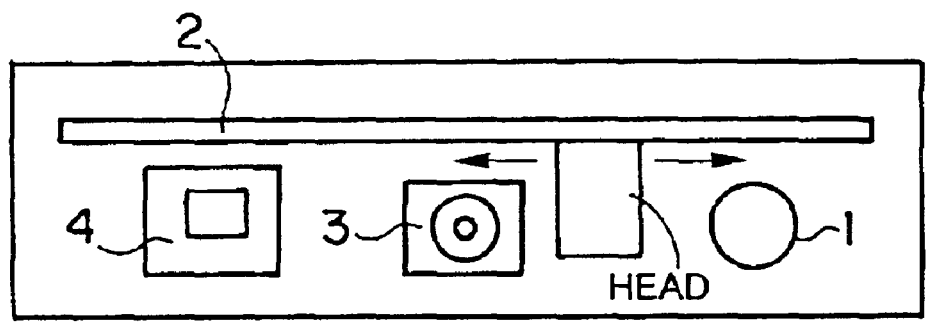

This embodiment is for transferring and bonding spherical bumps onto electrodes of a semiconductor device, a printed circuit board, or the like. Thus the apparatus according to this embodiment comprises a ball arranging unit 1, a carrier board conveying mechanism 2, ball inspection means 3, and a bonding stage 4, like the prior art apparatus shown in FIGS. 1A and 1B.

Figure 2:
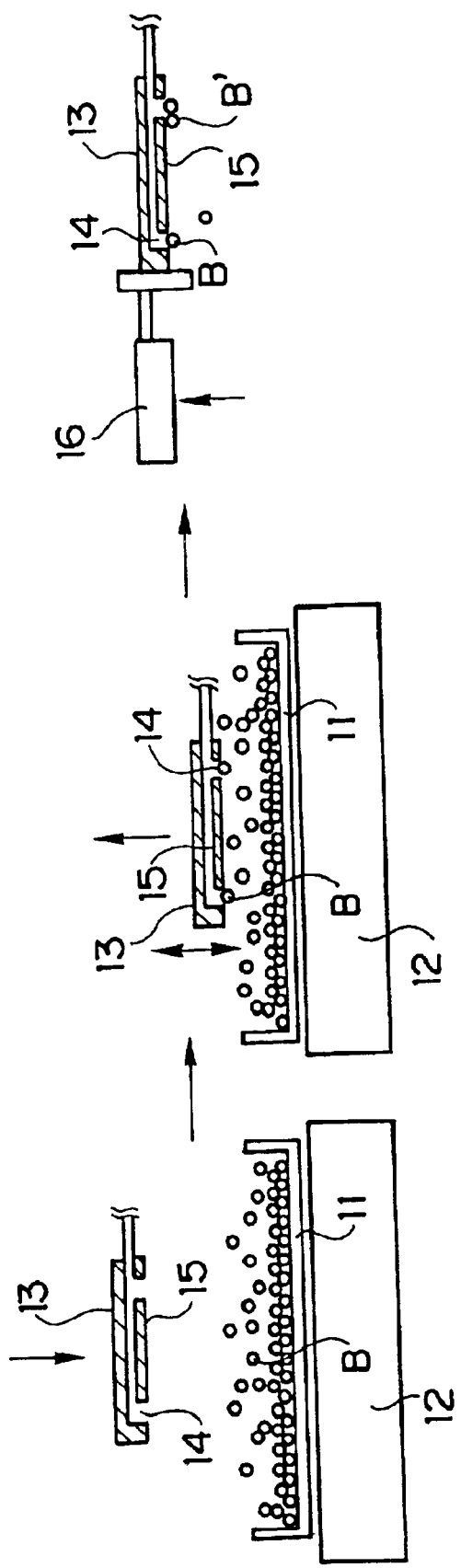
FIG. 2 is a representation showing a process for making a temporary ball arrangement in the prior art apparatus.
Figure 4:
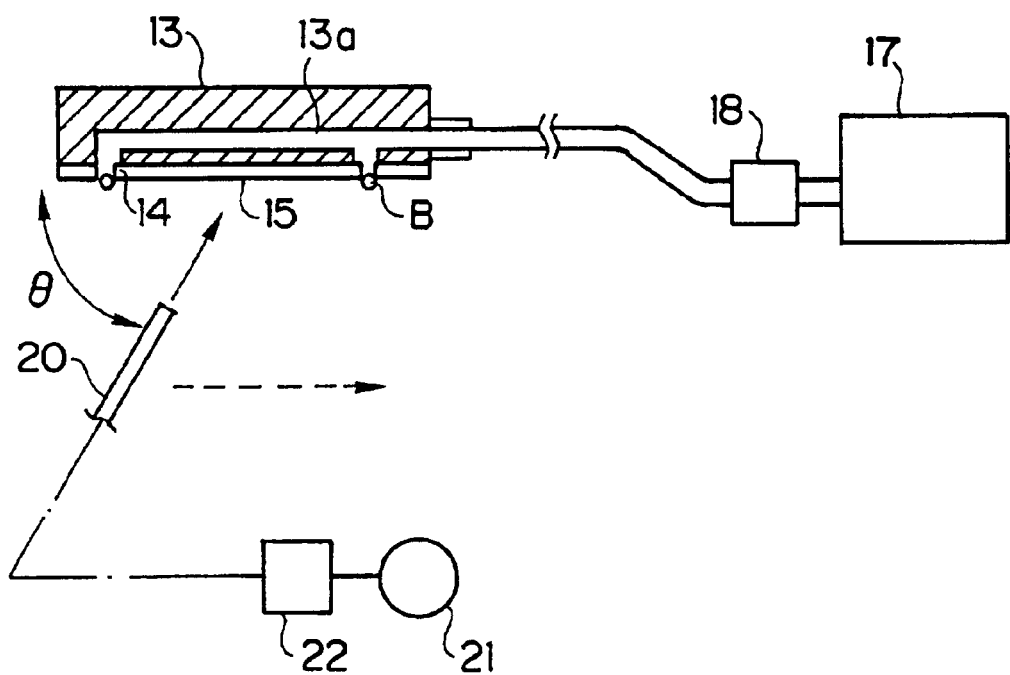
FIG. 4 is a partially sectional schematic side view of a principal part of an apparatus according to an embodiment of the present invention.

In this embodiment, balls are sucked onto a carrier board and temporarily arranged in a ball arrangement region of the carrier board. The balls are then transported to the bonding stage 4 where the balls are transferred onto an objective substance with their positions being adjusted. FIG. 4 shows a state that fine metallic balls B are temporarily arranged on the carrier board 15. The balls B picked up from a ball stocking tray 11 (see FIG. 2) are sucked onto suction holes 14 of the carrier board 15. Each suction hole 14 communicates with a reduced pressure space 13a of ball suction means 13, which is connected to a vacuum pump 17 through a pressure regulator 18. Although not shown in FIG. 4, such a vibrator 16 as described before (see FIG. 2) is provided for applying fine vibration to the ball suction means 13.

The apparatus of this embodiment is provided with a gas nozzle 20 disposed near the carrier board 15. The gas nozzle 20 is for applying gas blow to the ball arrangement region of the carrier board 15 so as to remove excess balls other than the normal balls exactly sucked onto the respective suction holes 14 in the ball arrangement region, as described later. The gas nozzle 20 is connected to a gas source 21 through a gas flow rate or pressure regulator 22. Gas used in this embodiment is preferably air or inert gas such as argon or nitrogen gas.

When air is used, the humidity is preferably 60% or less, more preferably, 50% or less. In particular, dry air whose humidity is 20% or less is most preferable. The humidity of 20% or less can prevent a excess ball from adhering through the moisture on the surface of the carrier board. If gas blow is applied when balls are sucked onto the carrier board, balls in the ball stocking tray 11 may be blown off. Thus gas blow is preferably applied after balls have been sucked onto the carrier board.

The gas nozzle 20 can be moved relatively to the carrier board 15. For this purpose, a nozzle support system (not shown) is provided which supports the gas nozzle 20 so as to be movable. The gas nozzle 20 can be moved as shown by a broken arrow in FIG. 4. Alternatively, the gas nozzle 20 may be fixed at a certain position and the carrier board 15 may move over the gas nozzle 20 while the carrier board 15 is conveyed from the ball arranging unit 1 to the ball inspection means 3 by the carrier board conveying mechanism 2 as shown in FIG. 1. In either case, by the gas nozzle 20 being moved relatively to the carrier board 15, gas blow can be applied thoroughly and evenly to the ball arrangement region of the carrier board 15.

The gas nozzle 20 is preferably inclined in relation to the ball arrangement plane on the carrier board 15 as shown in FIG. 4. The inclination angle θ of the gas nozzle 20 is preferably within the range of 5° to 175°, more preferably, within the range of 20° to 160°. The inclination angle θ can freely be set through the nozzle support system, i.e., the indirection of gas blow from the gas nozzle 20 can freely be controlled. The above range of the inclination angle θ contains the case that the gas nozzle 20 is perpendicular to the ball arrangement plane. In case of θ=0°, i.e., in case that gas blow is applied just laterally, however, setting of the gas nozzle 20 may become difficult because the ball size is very small in general. For this reason, the above range of 5° to 175° is practical.

As shown in FIG. 5A, the gas nozzle 20 preferably has its gas outlet 20a whose width W is broader than the ball arrangement width w on the carrier board 15. In the example of FIG. 5A, while the gas nozzle 20 is moved perpendicularly to the drawing paper surface, it can apply gas blow all over the ball arrangement region of the carrier board 15. In this example, W is larger than w by about 10 to 20 mm. Alternatively, W≦w, i.e., the width of the gas nozzle 20 may be not more than the ball arrangement width.

In this embodiment also usable are gas nozzles of various other shapes, e.g., as shown in FIGS. 5B to 5E. Further, a slender pipe gas nozzle can also be used. In case of the gas nozzle of FIG. 5B, when one of the vertical and lateral slits is put along the relative movement direction of the gas nozzle, removal efficiency perpendicular to the movement direction is improved. In case of the gas nozzle of FIG. 5C, gas blow can be concentrated at the position corresponding to each nozzle opening. In case of the gas nozzle of FIG. 5D or 5E, gas blow can be applied to a broader region. From among various gas nozzle shapes including the above examples, the most effective one can be selected in accordance with the ball arrangement pattern used.

As shown in FIG. 6A, the gas nozzle 20 is preferably a slit nozzle whose gas outlet is formed into a slit. This makes the control of gas blow easy. The slit width of the gas outlet 20a of the gas nozzle 20 is preferably within the range of about 0.1 to 10 mm. The gas outlet portion may have a tapered section toward the front end (FIG. 6B) or vice versa (FIG. 6C).

Not a single gas nozzle but two or more separate gas nozzles may be used. If two or more separate gas nozzles different in nozzle shape, attachment angle or direction, applying gas blow, or the like, are used, then effect to various forms of excess balls may be improved.

In this embodiment, balls B may be temporarily arranged on the carrier board 15 into an arrangement pattern as shown by solid lines in FIG. 7, which pattern corresponds to a rectangular outline along the periphery of the carrier board 15. Alternatively, the pattern may include the positions as shown by broken lines.

In this embodiment, balls are sucked onto the respective suction holes 14 of the carrier board 15 and temporarily arranged thereon. Gas blow is then applied from the gas nozzle 20 to the ball arrangement region of the carrier board 15 as shown in FIG. 4 so that normal balls B exactly sucked onto the respective suction holes 14 remain intact and excess balls other than the normal balls are removed. At this time, by having properly regulated the inclination angle θ of the gas nozzle 20 and the flow rate or pressure of the gas blow, only the excess balls can surely be removed.

In this manner, application of gas blow from the gas nozzle 20 brings about high efficiency of excess ball removal. However, cooperation with the vibrator 16 that applies vibration to the carrier board 15 is more effective. By applying supersonic vibration to the suction means 13 through the vibrator 16, the carrier board 15 is finely vibrated and excess balls are surely removed. When both of gas blow and fine vibration are used, the gas blow may be applied before or after the fine vibration. Of course, the gas blow and the fine vibration may be applied at once.

Figure 8A:
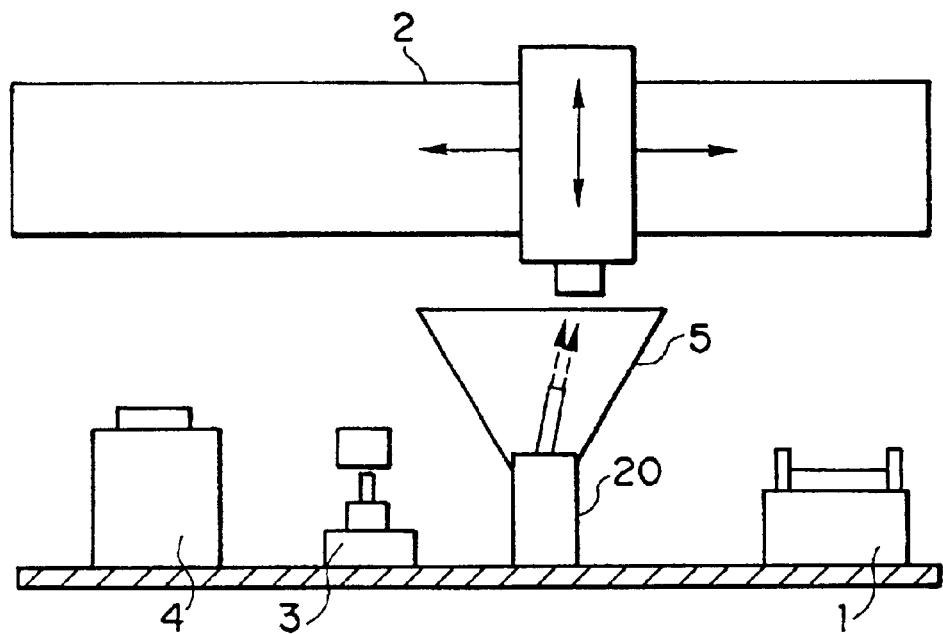
FIGS. 8A and 8B are schematic side and plane views showing the whole configuration of an apparatus with excess ball collecting means according to another embodiment of the present invention.
Figure 8B:
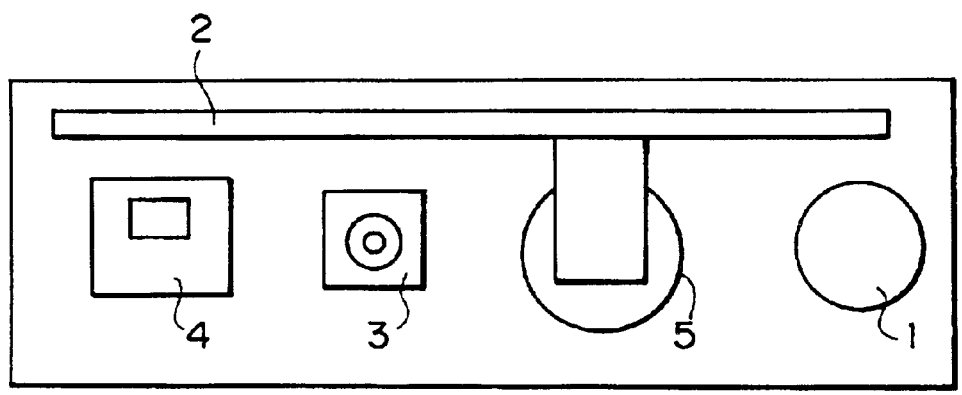

FIGS. 8A and 8B show another embodiment of the present invention including excess ball collecting means. After sucking balls, a suction head is stopped at a position over a gas nozzle and lowered into a collecting vessel 5, in which gas blow is applied so as to remove excess balls. Removed excess balls are collected in the collecting vessel 5 with which the gas nozzle is integrated. Thus the removed excess balls are never scattered in the other portions of the apparatus. If cut-off portions for allowing the suction head to pass are provided in the collecting vessel 5 of FIGS. 8A and 8B, excess balls can be removed with gas blow and collected into the collecting vessel 5 without stopping the suction head. Of course, the collecting vessel 5 may be provided separately from the gas nozzle. Besides, such collecting means is not a vessel but an adhesive tape or the like to which excess balls adhere.

As described before in connection with the prior art, there is a case that excess balls can not fully be removed only by fine vibration through the vibrator 16 due to soils or the like. According to the present invention, however, since gas blow is applied in addition to such fine vibration, excess balls can completely and surely be removed. In this case, because not so intense vibration through the vibrator 16 is required for full removal, each ball surface is prevented from being damaged.

According to another aspect of the present invention, balls temporarily arranged on the carrier board 15 are further sucked in a direction different from the suction holes so as to remove excess balls other than the normal balls exactly sucked onto the respective suction holes. An embodiment of the present invention in which excess balls are removed by suction will be described below.

In this embodiment, in place of the gas nozzle 20 as described above, a suction nozzle is disposed near the carrier board 15. Balls temporarily arranged on the carrier board 15 are sucked by the suction nozzle in a direction different from the suction holes of the carrier board 15. The suction nozzle may have substantially the same basic structure as the gas nozzle 20. The suction nozzle is designed to be movable relatively to the carrier board 15. The inclination angle or the like of the suction nozzle in relation to the ball arrangement plane can be set properly.

In this embodiment, the suction nozzle is connected to a vacuum source (pump), a pressure regulator, or the like, and its suction force is controllable. The suction nozzle may be a slit nozzle but it must have an inner diameter allowing excess balls to be sucked into the nozzle.

In this embodiment, while the suction nozzle is moved relatively to the carrier board 15, balls temporarily arranged on the carrier board 15 are sucked by the suction nozzle in a direction different from the suction holes of the carrier board 15 so as to remove excess balls. Because the excess balls are sucked into the nozzle, the removed excess balls are never scattered in the other portions of the apparatus. This embodiment is thus convenient because separate excess ball collecting means is not required.

Also in this embodiment, cooperation with the vibrator 16 that applies vibration to the carrier board 15 is more effective. Like the above-described embodiment, by applying supersonic vibration to the carrier board 15 through the vibrator 16, the carrier board 15 is finely vibrated and excess balls are surely and efficiently removed by suction. When both of suction for removal and fine vibration are used, the suction for removal may be performed before or after applying the fine vibration. Of course, the suction for removal may be performed simultaneously with application of the fine vibration.

Excess balls are preferably removed in a state that balls are fully firmly fixed to the ball arrangement region of the carrier board. When excess balls are removed by gas blow or suction, for ensuring that the normal balls exactly sucked onto the respective suction holes are left intact, the suction force at each suction hole must be sufficiently high. Besides, it is also effective that each suction hole has not a tapered shape but such a shape that the edge portion of the outlet opening comes into contact with the ball being sucked so as to obtain high adhesion. If the suction force is too high, however, the ball too strongly adheres to the edge portion of the suction hole and the ball may become difficult to drop off when it should be transferred onto the objective substance. Therefore, when the ball is to be transferred, it is effective that the vacuum for sucking the ball onto the suction hole is broken or the pressure is increased beyond the atmospheric pressure and further vibration is applied to the carrier board. The vibration to be applied may be either vertical or lateral, though it is preferable to use both at once. The vibration frequency is preferably within the range of 5 to 500 kHz, more preferably, within the range of 20 to 200 kHz. Supersonic vibration is preferable. Too low vibration frequency results in little dropping-off effect while too high vibration frequency may cause local deformation of or damage on the ball surface. The timing of applying vibration is preferable when balls are brought into contact with flux applied on the objective substance onto which the balls are to be transferred. The thickness of the flux is preferably within the range of $\frac{1}{8}$ to $\frac{2}{3}$ of the ball diameter. A thickness less than $\frac{1}{8}$ results in little adhesion so it little contributes the ball transference while a thickness more than $\frac{2}{3}$ may contaminate the carrier board.

Experimental Results

Experimental results according to the present invention will be described below. In this experiment, gas blow was applied through the gas nozzle 20 as described above.

In this experiment, nitrogen gas was used as gas to be blown against the ball arrangement region of the carrier board 15. The $N_2$ gas flow rate was within the range of 20 to 40l/min. The inclination angle θ of the gas nozzle 20 was set within the range of 45° to 135°. Balls B having a diameter of 30 to 300 μm were used. The balls B were sucked by a suction pressure of −350 to −750 mmHg. The distance of the gas nozzle 20 from the ball arrangement plane on the carrier board 15 was about 0.1 to 10.0 mm.

Balls B were sucked onto the carrier board 15 under the above conditions and then supersonic fine vibration was applied to the carrier board 15. In 50 times of examination, one to ten excess balls remained. The carrier board 15 under the same conditions was passed over the gas nozzle 20 and $N_2$ gas blow was applied to the carrier board under the above conditions. As a result, the number of excess balls remaining was zero, i.e., excess balls could be fully removed.

The following tables 1 to 4 show results of various experiments for the above-described Q value. It was found that the Q value is preferably 0.8 or less, more preferably, 0.6 or less.

TABLE 1

| $r_b$ (μm) | $r_a$ (μm) | Q value | normal ball held |
|---|---|---|---|
| 50 > $r_b$ ≧ 10 | 1/10–9/10 of $r_b$ | ≧0.9 | x |
| | | 0.9 ≧ Q > 0.8 | Δ |
| | | 0.8 ≧ Q > 0.7 | ○ |
| | | 0.7 ≧ Q > 0.6 | ○ |
| | | 0.6 ≧ Q > 0.5 | ⊚ |
| | | 0.5 ≧ Q > 0.4 | ⊚ |
| | | 0.4 ≧ Q > 0.3 | ⊚ |
| | | 0.3 ≧ Q > 0.2 | ⊚ |
| | | 0.2 ≧ Q > 0.1 | ⊚ |
| | | 0.1 ≧ Q > 0.0 | ⊚ |

TABLE 2

| $r_b$ (μm) | $r_a$ (μm) | Q value | normal ball held |
|---|---|---|---|
| 100 > $r_b$ ≧ 50 | 1/10–9/10 of $r_b$ | ≧0.9 | x |
| | | 0.9 ≧ Q > 0.8 | x |
| | | 0.8 ≧ Q > 0.7 | ○ |
| | | 0.7 ≧ Q > 0.6 | ○ |
| | | 0.6 ≧ Q > 0.5 | ⊚ |
| | | 0.5 ≧ Q > 0.4 | ⊚ |
| | | 0.4 ≧ Q > 0.3 | ⊚ |
| | | 0.3 ≧ Q > 0.2 | ⊚ |
| | | 0.2 ≧ Q > 0.1 | ⊚ |
| | | 0.1 ≧ Q > 0.0 | ⊚ |

TABLE 3

| $r_b$ (μm) | $r_a$ (μm) | Q value | normal ball held |
|---|---|---|---|
| 200 > $r_b$ ≧ 100 | 1/10–9/10 of $r_b$ | ≧0.9 | x |
| | | 0.9 ≧ Q > 0.8 | x |
| | | 0.8 ≧ Q > 0.7 | ○ |
| | | 0.7 ≧ Q > 0.6 | ○ |
| | | 0.6 ≧ Q > 0.5 | ⊚ |
| | | 0.5 ≧ Q > 0.4 | ⊚ |
| | | 0.4 ≧ Q > 0.3 | ⊚ |
| | | 0.3 ≧ Q > 0.2 | ⊚ |
| | | 0.2 ≧ Q > 0.1 | ⊚ |
| | | 0.1 ≧ Q > 0.0 | ⊚ |

TABLE 4

| $r_b$ (μm) | $r_a$ (μm) | Q value | normal ball held |
|---|---|---|---|
| 300 > $r_b$ ≧ 200 | 1/10–9/10 of $r_b$ | ≧0.9 | x |
| | | 0.9 ≧ Q > 0.8 | Δ |
| | | 0.8 ≧ Q > 0.7 | ○ |
| | | 0.7 ≧ Q > 0.6 | ○ |
| | | 0.6 ≧ Q > 0.5 | ⊚ |
| | | 0.5 ≧ Q > 0.4 | ⊚ |
| | | 0.4 ≧ Q > 0.3 | ⊚ |
| | | 0.3 ≧ Q > 0.2 | ⊚ |
| | | 0.2 ≧ Q > 0.1 | ⊚ |
| | | 0.1 ≧ Q > 0.0 | ⊚ |

Each experiment in relation to the tables 1 to 4 was done using a carrier board with 300 suction holes. Inspection was done n=100 times per experiment. The respective symbols used in the tables represent the following experimental results:

X: removal of 20 or more normal balls occurs five or more times

Δ: removal of 10 or more normal balls occurs five or more times

○: removal of one or more normal balls occurs one or more times

⊚: no normal ball was removed

Gas blow through the gas nozzle 20 may be applied not only with the direction, the flow rate, etc., being fixed but also with those being changed at predetermined timings or cycles.

The balls B to be arranged on the carrier board 15 can be made of various materials such as gold or solder. The present invention is effective to balls of any material.

As described above, according to the present invention, balls are sucked onto a carrier board and they are temporarily arranged in a ball arrangement region of the board. Gas blow is applied to the balls or the balls are sucked in a direction opposite to the carrier board so that only excess balls other than the normal balls exactly sucked onto the ball arrangement region are fully removed. According to the present invention, there is little possibility that the surface of each normal ball is damaged, so the quality is improved.

Besides, by using gas blow in cooperation with vibrating means, even excess balls that can not be removed only by vibration can be removed. Thus, more effective removal of excess balls is realized. As a result, the yield in mass production of spherical bumps is improved. Besides, since the ball surface is not damaged, erroneous detection in the subsequent inspection process is prevented. This improves the yield of products onto which balls have been transferred.

What is claimed is:

1. A ball transferring method comprising the steps of:
    sucking balls onto a carrier board so as to arrange temporarily said balls in a ball arrangement region of said carrier board, wherein said balls have a diameter of less than 300 μm;
    applying gas blow to said ball arrangement region so as to remove excess balls other than balls that have been exactly sucked onto said ball arrangement region; wherein said gas blow has a velocity of v or less, wherein gas blow velocity v is calculated by a formula:

$$v = (2Q \cdot F_r \cdot r_a / (\rho S_b \cdot (r_b^2 - r_a^2)^{1/2}))^{1/2}$$

wherein
    Q is a coefficient equal to 0.8 or less;
    $F_r$ is suction force sucking the balls onto the carrier board;
    $r_a$ is radius of suction holes; $r_b$ is radius of balls;
    ρ represents gas density of the applied gas blow;
    $S_b$ is vertical sectional area of a ball portion protruding beyond a ball arrangement plane;
    transferring and bonding the remaining balls onto an objective substance with positional adjustment being made.

2. The method according to claim 1, wherein said gas blow is applied through a gas nozzle moving relatively to said carrier board.

3. The method according to claim 1, wherein said gas blow consists of at least one of air, inert gas, and nitrogen gas.

4. The method according to claim 1, wherein said gas blow is applied d in a direction inclined in relation to the ball arrangement plane on said carrier board.

5. The method according to claim 1, wherein fine vibration, which does not damage said balls that have been exactly sucked onto said ball arrangement region, is applied to said carrier board when said excess balls are removed.

6. The method according to claim 5, wherein said vibration within the range of 5 to 500 kHz is applied to said carrier board.

7. A ball transferring method comprising the steps of:
    sucking balls onto a carrier board so as to arrange temporarily said balls in a ball arrangement region of said carrier board, wherein said balls have a diameter of less than 300 μm;

sucking said ball arrangement region so as to remove excess balls other than balls that ha e been exactly sucked onto said ball arrangement region; wherein said gas blow has a velocity of v or less, wherein gas blow velocity v is calculated by a formula:

$$v=(2Q\cdot F_r\cdot r_a/(\rho S_b\cdot(r_b^2-r_a^2)^{1/2}))^{1/2}$$

wherein

Q is a coefficient equal to 0.8 or less;

$F_r$ is suction force sucking the balls onto the carrier board;

$r_a$ is radius of suction holes;

$r_b$ is radius of balls;

$\rho$ represents gas density of the applied gas blow;

$S_b$ is vertical sectional area of a ball portion protruding beyond a ball arrangement plane;

transferring and bonding the remaining balls onto an objective substance with positional adjustment being made.

8. The method according to claim 7, wherein said ball arrangement region is sucked through a suction nozzle moving relatively to said carrier board.

9. The method according to claim 8, wherein said ball arrangement region is sucked through said suction nozzle from a direction inclined in relation to the ball arrangement plane on said carrier board.

10. The method according to claim 7, wherein fine vibration, which does not damage said balls that have been exactly sucked onto said ball arrangement region, is applied to said carrier board when said excess balls are removed.

11. The method according to claim 10, wherein said vibration within the range of 5 to 500 kHz is applied to said carrier board.

12. A ball transferring method comprising the steps of:

sucking balls onto a carrier board so as to arrange temporarily said balls in a ball arrangement region of said carrier board, wherein said balls have a diameter of less than 300 μm;

in a state that said balls are fully firmly fixed to said ball arrangement region, applying gas blow through a nozzle to said ball arrangement region or sucking said balls through a nozzle, so as to remove excess balls other than balls that have been exactly suck onto said ball arrangement region;

said gas blow has a velocity of v or less, wherein gas blow velocity v is calculated by a formula:

$$v=(2Q\cdot F_r\cdot r_a/(\rho S_b\cdot(r_b^2-r_a^2)^{1/2}))^{1/2}$$

wherein:

Q is a coefficient equal to 0.8 or less, $F_r$ is suction force sucking the balls onto the carrier board;

$r_a$ is radius of suction holes;

$r_b$ is radius of balls;

$\rho$ represents gas density of the applied gas blow;

$S_b$ is vertical sectional area of a ball portion protruding beyond a ball arrangement plane;

when transferring the remaining balls onto an objective substance with positional adjustment being made, applying vibration to said carrier board so that said balls which have been sucked to be in contact with said ball arrangement region may be allowed to drop off.

13. The method according to claim 12, wherein said vibration within the range of 5 to 500 kHz is applied to said carrier board.

14. The method according to claim 12, wherein fine vibration, which does not damage said balls that have been exactly sucked onto said ball arrangement region, is applied to said carried board when said excess balls are removed.

* * * * *